United States Patent
Sugiyama

(10) Patent No.: US 8,898,875 B2
(45) Date of Patent: Dec. 2, 2014

(54) METHOD OF MANUFACTURING PIEZOELECTRIC VIBRATORS

(75) Inventor: Takeshi Sugiyama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 611 days.

(21) Appl. No.: 12/868,062

(22) Filed: Aug. 25, 2010

(65) Prior Publication Data

US 2011/0050043 A1 Mar. 3, 2011

(30) Foreign Application Priority Data

Aug. 25, 2009 (JP) .............................. JP2009-194468

(51) Int. Cl.
| | | |
|---|---|---|
| H03H 3/02 | (2006.01) | |
| H03H 9/21 | (2006.01) | |
| H03H 9/10 | (2006.01) | |
| G04R 20/10 | (2013.01) | |

(52) U.S. Cl.
CPC . *H03H 9/21* (2013.01); *H03H 3/02* (2013.01); *H03H 9/1021* (2013.01); *G04R 20/10* (2013.01); *H03H 2003/022* (2013.01)
USPC ........... 29/25.35; 29/830; 29/594; 29/896.22; 310/344; 310/348; 310/351; 438/118; 438/406; 438/455; 156/273.1; 156/274.8

(58) Field of Classification Search
USPC ............ 29/25.35, 830, 594, 896.22; 310/344, 310/348, 351, 349; 438/118, 406, 455; 156/273.1, 274.4, 273.4, 274.8, 701, 156/273.3
See application file for complete search history.

(56) References Cited

U.S. PATENT DOCUMENTS

| | | | |
|---|---|---|---|
| 5,235,238 A * | 8/1993 | Nomura et al. ................ | 310/349 |
| 6,537,938 B1 | 3/2003 | Miyazaki | |
| 7,205,625 B2 * | 4/2007 | Nakamura et al. ........ | 438/406 X |
| 7,294,951 B2 * | 11/2007 | Oouchi et al. ........... | 29/25.35 X |
| 7,531,945 B2 * | 5/2009 | Aratake ........................ | 310/344 |

FOREIGN PATENT DOCUMENTS

| | | | | |
|---|---|---|---|---|
| JP | 05199056 A | * | 8/1993 | |
| JP | 05217828 A | * | 8/1993 | |
| JP | 10259039 A | * | 9/1998 | |
| JP | 2001-072433 A | | 3/2001 | |
| JP | 2008035276 A | * | 2/2008 | |

OTHER PUBLICATIONS

Machine Language Translation of JP 10-259039.*
Machine Language Translation of Japanese Patent Publication JP 5-199056.*
Machine Language Translation of Japanese Patent Publication JP 2008-35276.*

* cited by examiner

*Primary Examiner* — A. Dexter Tugbang
(74) *Attorney, Agent, or Firm* — Brinks Gilson & Lione

(57) ABSTRACT

Providing a method for manufacturing a package capable of achieving reliable anodic bonding between the bonding material and a base board wafer even when the bonding material having a large resistance value is used. Providing a method for manufacturing a package by anodically bonding a bonding material, which is fixed in advance to an inner surface of a lid board wafer made of an insulator, to an inner surface of a base board wafer made of an insulator, the method including an anodic bonding step where an auxiliary bonding material serving as an anode is disposed on an outer surface of the lid board wafer, a cathode is disposed on an outer surface of the base board wafer, and a voltage is applied between the auxiliary bonding material and the cathode, wherein the auxiliary bonding material is made of a material that causes an anodic bonding reaction between the auxiliary bonding material and the lid board wafer in the anodic bonding step.

10 Claims, 14 Drawing Sheets

METHOD OF MANUFACTURING PIEZOELECTRIC VIBRATORS

RELATED APPLICATIONS

This application claims priority under 35 U.S.C. §119 to Japanese Patent Application No. 2009-194468 filed on Aug. 25, 2009, the entire content of which is hereby incorporated by reference.

BACKGROUND OF THE INVENTION

1. Field of the Invention

The present invention relates to a method for manufacturing a package, a method for manufacturing a piezoelectric vibrator, and an oscillator, an electronic device, and a radio-controlled timepiece each having the piezoelectric vibrator.

2. Description of the Related Art

Recently, a piezoelectric vibrator utilizing quartz or the like is used in a cellular phone and a portable information terminal as the time source, the timing source of a control signal, a reference signal source, and the like. Although there are various piezoelectric vibrators of this type, an SMD-type piezoelectric vibrator is known as one example thereof. As the piezoelectric vibrator of this type, a three-layered piezoelectric vibrator in which a piezoelectric board having a piezoelectric vibrating reed formed thereon is interposed between a base board and a lid board is known. In this case, the piezoelectric vibrator is accommodated in a cavity (sealed space) that is formed between the base board and the lid board.

Moreover, in recent years, instead of the three-layered piezoelectric vibrator, a two-layered piezoelectric vibrator has also been developed. The piezoelectric vibrator of this type has a two-layered structure in which a base board and a lid board are directly bonded and packaged, and a piezoelectric vibrating reed is accommodated in a cavity formed between the two boards. The packaged two-layered piezoelectric vibrator is suitably used in that it is excellent in achieving a thin profile compared with the three-layered structure.

As a method of directly bonding the base board and the lid board which are made of a glass material, anodic bonding is proposed. For example, JP-A-2001-72433 disclosed an anodic bonding method that involves fixing a bonding material to an inner surface of one board, and then connecting a probe to the bonding material to be used as an anode, disposing a cathode on an outer surface of the other board, and applying a voltage between the bonding material and the cathode to bond the bonding material to an inner surface of the other board. As a material of the bonding material, Al is used.

However, there is a problem in that when the bonding material used for the anodic bonding is exposed to the outside of the bonded package, the bonding material made of Al will be corroded, and airtightness of the package will be degraded.

Therefore, in recent years, the use of Si as material of the bonding material has been investigated.

However, since the Si film has a large sheet resistance, when the thin bonding material is made of Si, the resistance value will increase. For this reason, when the probe is connected to the bonding material during the anodic bonding, a voltage drop will increase in proportion to a distance from a probe connection point. As a result, there is a problem in that the potential of the bonding material will be uneven, and anodic bonding is not achieved at positions distant from the probe connection point although anodic bonding is achieved near the probe connection point.

In order to achieve the anodic bonding at positions distant from the probe connection point, it is necessary to perform anodic bonding by applying a high voltage, which may however increase the amount of energy consumption.

In addition, in order to form a Si film having a low resistance value, it is necessary to form the Si film by sputtering, CVD, and the like at a high temperature (800° C. or higher). However, since the softening point of a glass board that forms the Si film is about 600° C., it is difficult to form the Si film on the glass board at a high temperature.

SUMMARY OF THE INVENTION

The present invention has been made in view of the foregoing, and an object of the present invention is to provide a method for manufacturing a package capable of achieving reliable anodic bonding between the bonding material and the board even when the bonding material having a large resistance value is used and to provide a method for manufacturing a piezoelectric vibrator.

In order to solve the problems, according to an aspect of the present invention, there is provided a method for manufacturing a package by anodically bonding a bonding material, which is fixed in advance to an inner surface of a first board made of an insulator, to an inner surface of a second board made of an insulator, the method including an anodic bonding step where an auxiliary bonding material serving as an anode is disposed on an outer surface of the first board, a cathode is disposed on an outer surface of the second board, and a voltage is applied between the auxiliary bonding material and the cathode, wherein the auxiliary bonding material is made of a material that causes an anodic bonding reaction between the auxiliary bonding material and the first board in the anodic bonding step.

According to this configuration, when a voltage is applied between the auxiliary bonding material and the cathode, an anodic bonding reaction occurs between the auxiliary bonding material and the outer surface of the first board, and in conjunction with this, the bonding material and the inner surface of the second board are anodically bonded. In this way, even when a bonding material having a large resistance is used, it is possible to apply a uniform voltage to the entire surface of the bonding material and achieve reliable anodic bonding between the bonding material and the inner surface of the second board. In addition, since the resistance value of the auxiliary bonding material can be set arbitrarily, by using an auxiliary bonding material having a small resistance value, it is possible to achieve the anodic bonding under the same condition as the case of using a bonding material having a small resistance value.

In addition, the bonding material is preferably made of Al, a Si film, or a bulk material of Si. The bonding material is particularly preferably made of a Si film.

Since the Si film has a large sheet resistance, the resistance value increases when the thin bonding material is made of Si. However, according to the present invention, it is possible to achieve reliable anodic bonding between the bonding material and the inner surface of the second board. Moreover, even when the bonding material used for the anodic bonding is exposed to the outside of the bonded package, since the bonding material made of Si will not be corroded, it is possible to prevent degradation of airtightness of the package.

In addition, the auxiliary bonding material is preferably made of Al, a bulk material of Si, Cr or C.

According to this configuration, since it is possible to achieve a reliable anodic bonding reaction between the auxiliary bonding material and the outer surface of the first board, it is possible to achieve reliable anodic bonding between the bonding material and the inner surface of the second board in conjunction with this.

In addition, the auxiliary bonding material is preferably a thin film of an aluminum foil or the like.

By using a thin film of an aluminum foil or the like which is easy to handle and cheap as the auxiliary bonding material, it is possible to suppress an increase in manufacturing cost. In addition, since the thin film of an aluminum foil or the like has a small thickness, it can be easily removed after completion of the anodic bonding step.

In addition, the manufacturing method preferably includes a step of removing the auxiliary bonding material after completion of the anodic bonding step.

According to this configuration, it is possible to manufacture the same package as the related art having no remaining auxiliary bonding material.

According to another aspect of the present invention, there is provided a method for manufacturing a piezoelectric vibrator by vacuum-sealing a piezoelectric vibrating reed in a package which is manufactured by using the manufacturing method of the package according to the above aspect of the present invention.

According to this configuration, since the piezoelectric vibrator has the package which has excellent airtightness and in which the bonding material and the board are reliably anodically bonded, it is possible to improve reliability of vacuum sealing of the piezoelectric vibrating reed. In this way, since a series resonance resistance value (R1) of the piezoelectric vibrator is maintained at a low state, it is possible to vibrate the piezoelectric vibrating reed with a low power. Thus, it is possible to manufacture a piezoelectric vibrator having excellent energy efficiency.

According to a further aspect of the present invention, there is provided an oscillator in which the piezoelectric vibrator according to the above aspect of the present invention is electrically connected to an integrated circuit as an oscillating piece.

According to a still further aspect of the present invention, there is provided an electronic device in which the piezoelectric vibrator according to the above aspect of the present invention is electrically connected to a timer portion.

According to a still further aspect of the present invention, there is provided a radio-controlled timepiece in which the piezoelectric vibrator according to the above aspect of the present invention is electrically connected to a filter portion.

According to these aspects, since the oscillator, electronic device, and radio-controlled timepiece have the piezoelectric vibrator having excellent energy efficiency, it is possible to manufacture the oscillator, electronic device, and radio-controlled timepiece having excellent energy efficiency.

According to the manufacturing method of the package according to the above aspect of the present invention, when a voltage is applied between the auxiliary bonding material and the cathode, an anodic bonding reaction occurs between the auxiliary bonding material and the outer surface of the first board, and in conjunction with this, the bonding material and the inner surface of the second board are anodically bonded. In this way, even when a bonding material having a large resistance value is used, it is possible to apply a uniform voltage to the entire surface of the bonding material and achieve reliable anodic bonding between the bonding material and the inner surface of the second board. In addition, since the resistance value of the auxiliary bonding material can be set arbitrarily, by using an auxiliary bonding material having a small resistance value, it is possible to achieve the anodic bonding under the same condition as the case of using a bonding material having a small resistance value.

DETAILED DESCRIPTION OF THE PREFERRED EMBODIMENTS

Piezoelectric Vibrator

Figure 1:
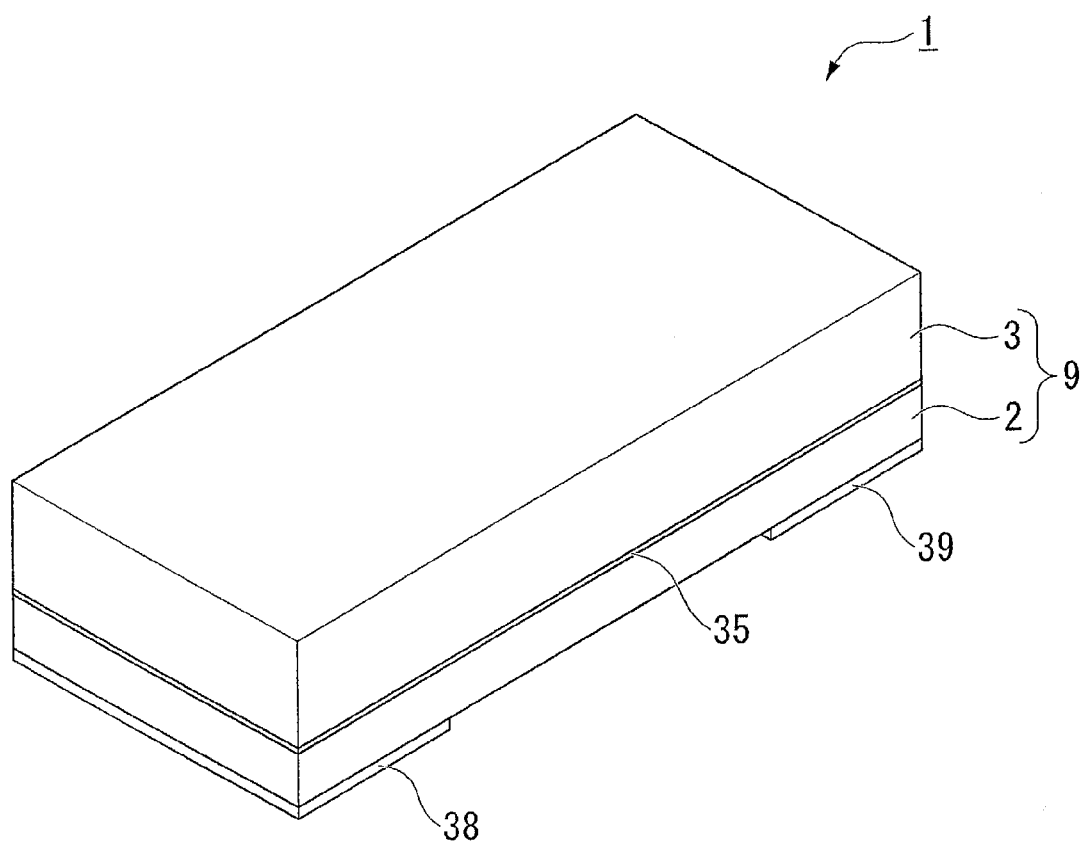
FIG. 1 is a perspective view showing an external appearance of a piezoelectric vibrator according to an embodiment of the present invention.
Figure 2:
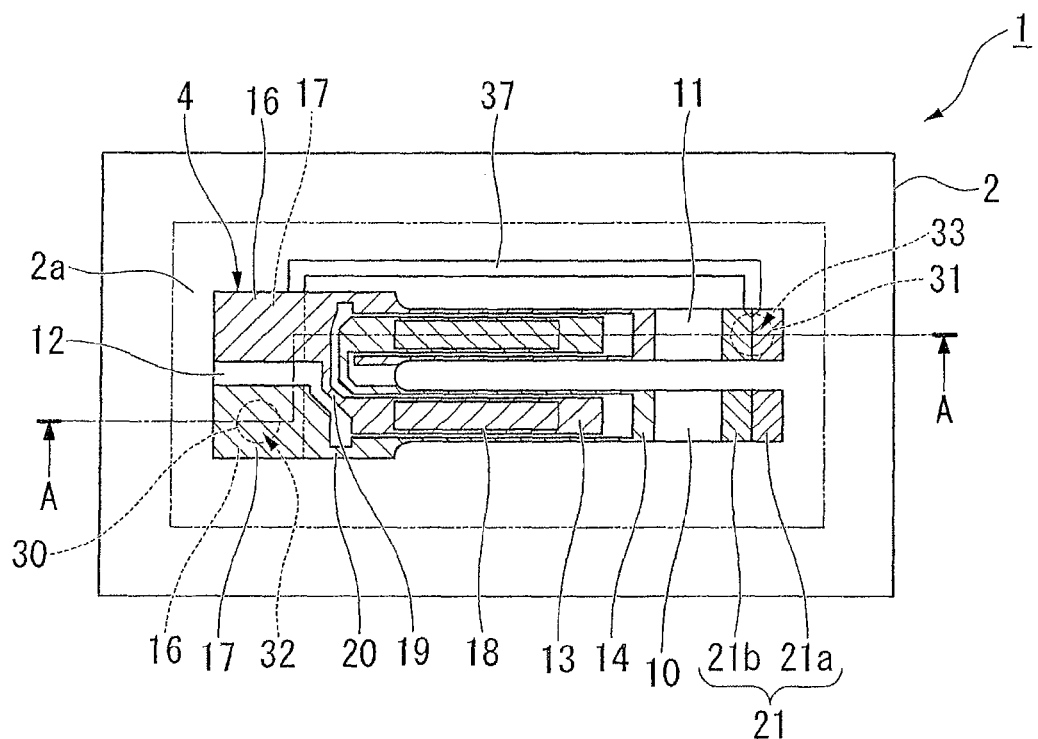
FIG. 2 is a top view showing a state where a lid board of the piezoelectric vibrator is removed.
Figure 3:
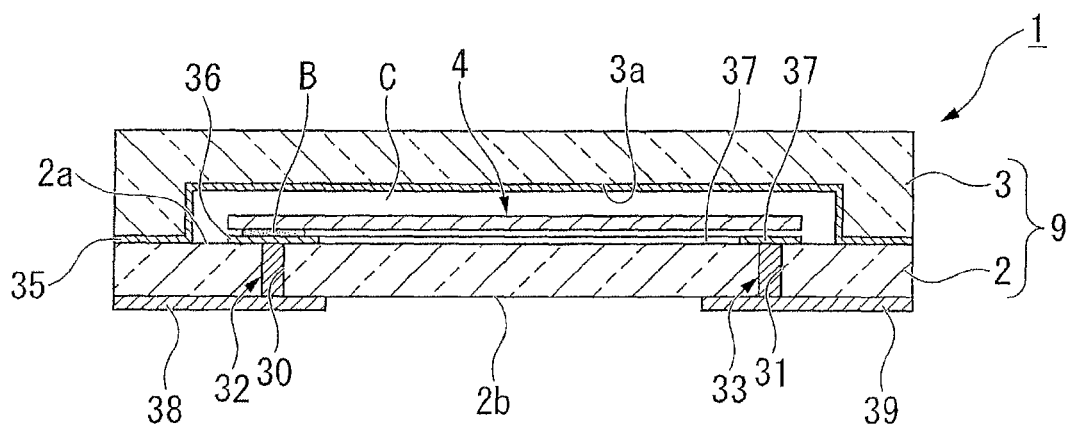
FIG. 3 is a side sectional view taken along the line A-A in FIG. 2.
Figure 4:
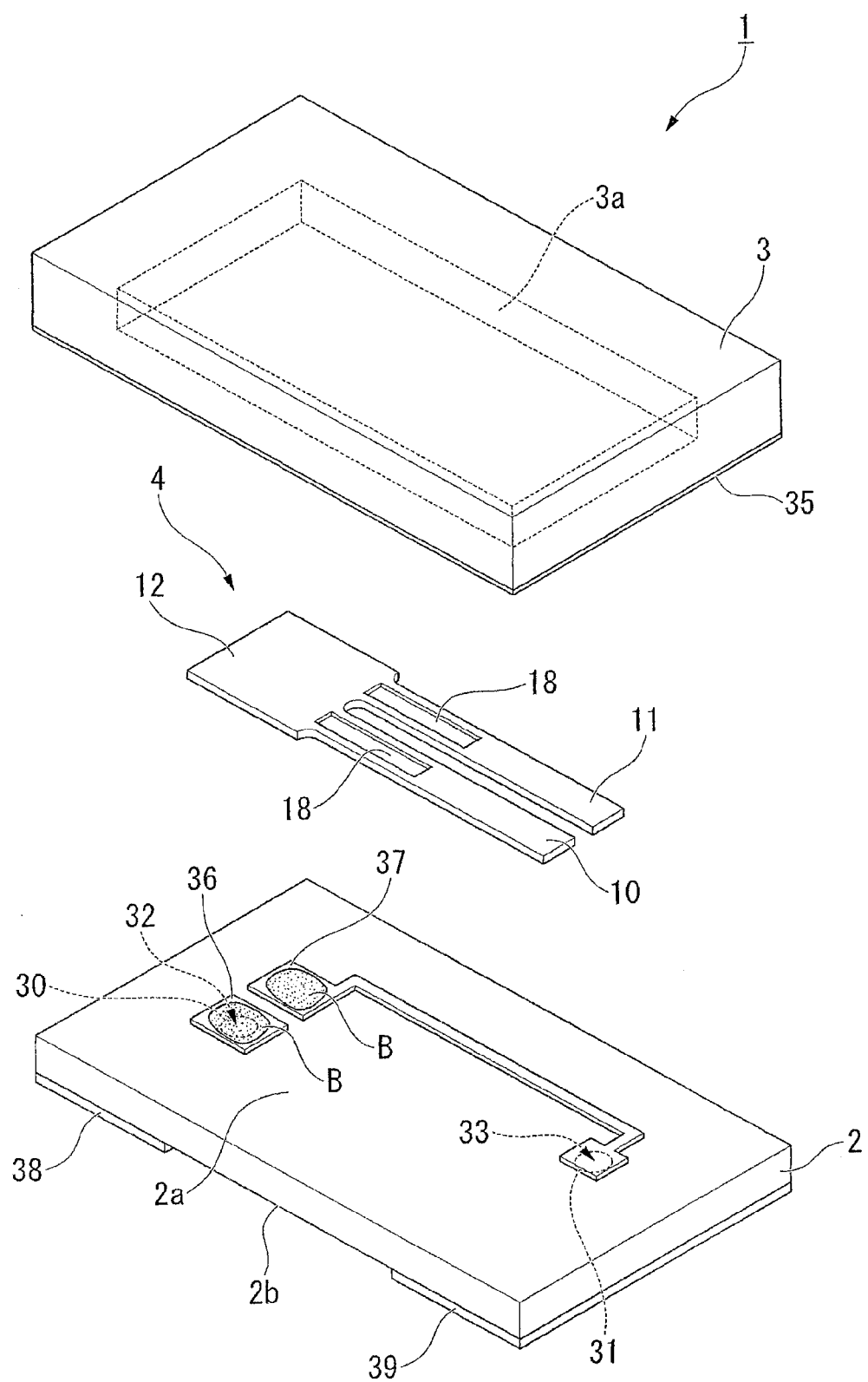
FIG. 4 is an exploded perspective view of the piezoelectric vibrator.

Hereinafter, a piezoelectric vibrator according to an embodiment of the present invention will be described with reference to the drawings. FIG. 1 is a perspective view showing an external appearance of a piezoelectric vibrator according to an embodiment of the present invention. FIG. 2 is a top view showing a state where a lid board of the piezoelectric vibrator is removed. FIG. 3 is a side sectional view taken along the line A-A in FIG. 2. FIG. 4 is an exploded perspective view of the piezoelectric vibrator. In FIG. 4, for better understanding of the drawings, illustrations of the excitation electrode 15, extraction electrodes 19 and 20, mount electrodes 16 and 17, and weight metal film 21 of the piezoelectric vibrating reed 4, which will be described later, are omitted.

As shown in FIGS. 1 to 4, a piezoelectric vibrator 1 according to the present embodiment is an SMD-type piezoelectric vibrator 1 including: a package 9 having a base board 2 and a lid board 3 which are anodically bonded by a bonding material 35; and a piezoelectric vibrating reed 4 which is accommodated in a cavity C of the package 9.

Figure 5:
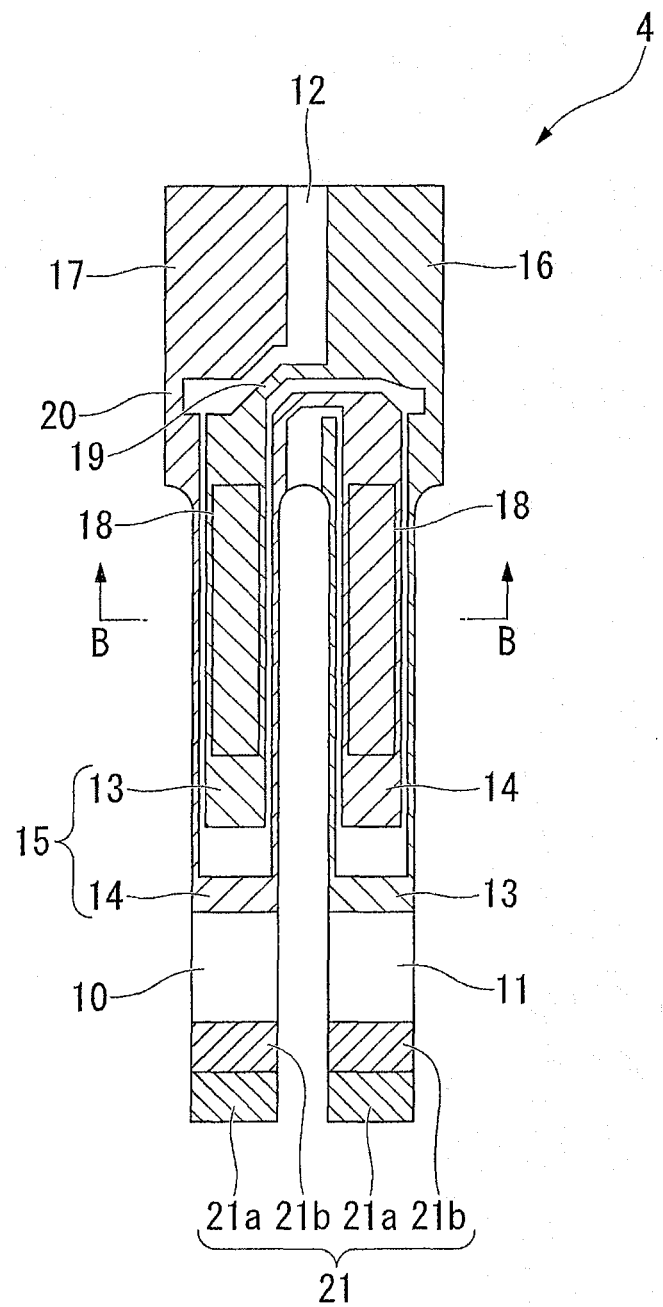
FIG. 5 is a top view of the piezoelectric vibrating reed.
Figure 6:
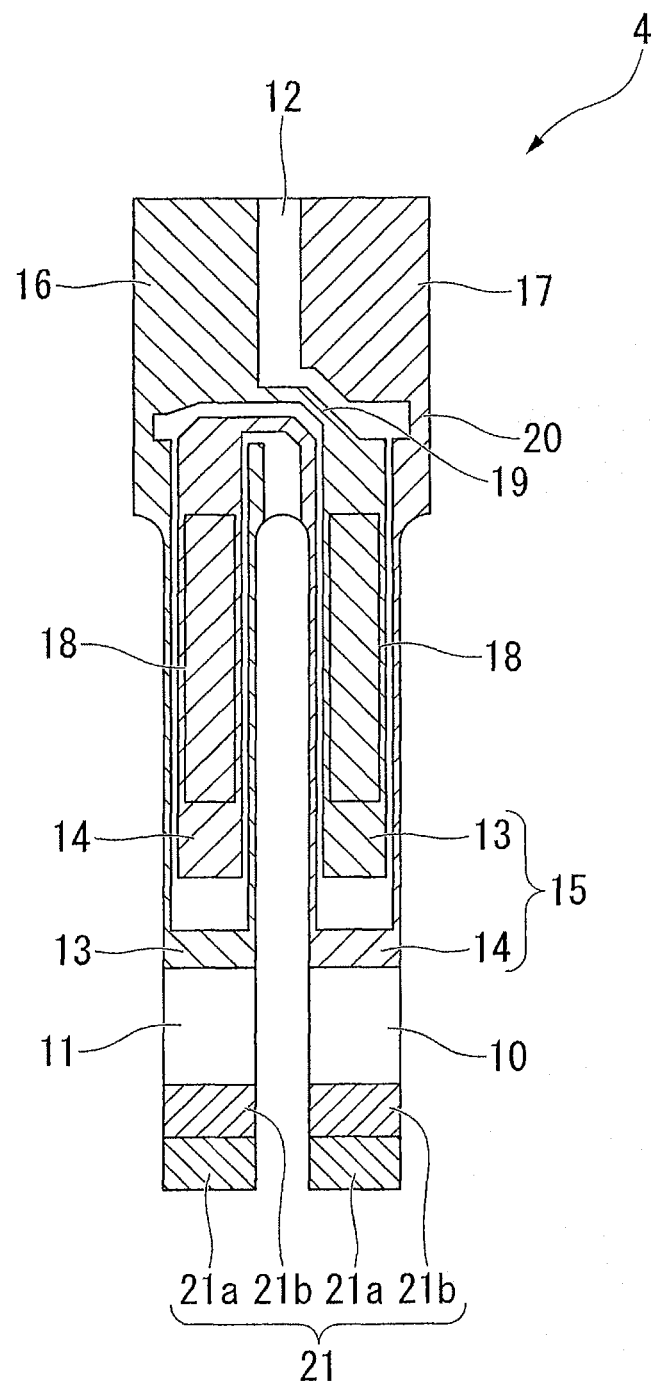
FIG. 6 is a bottom view of the piezoelectric vibrating reed.
Figure 7:
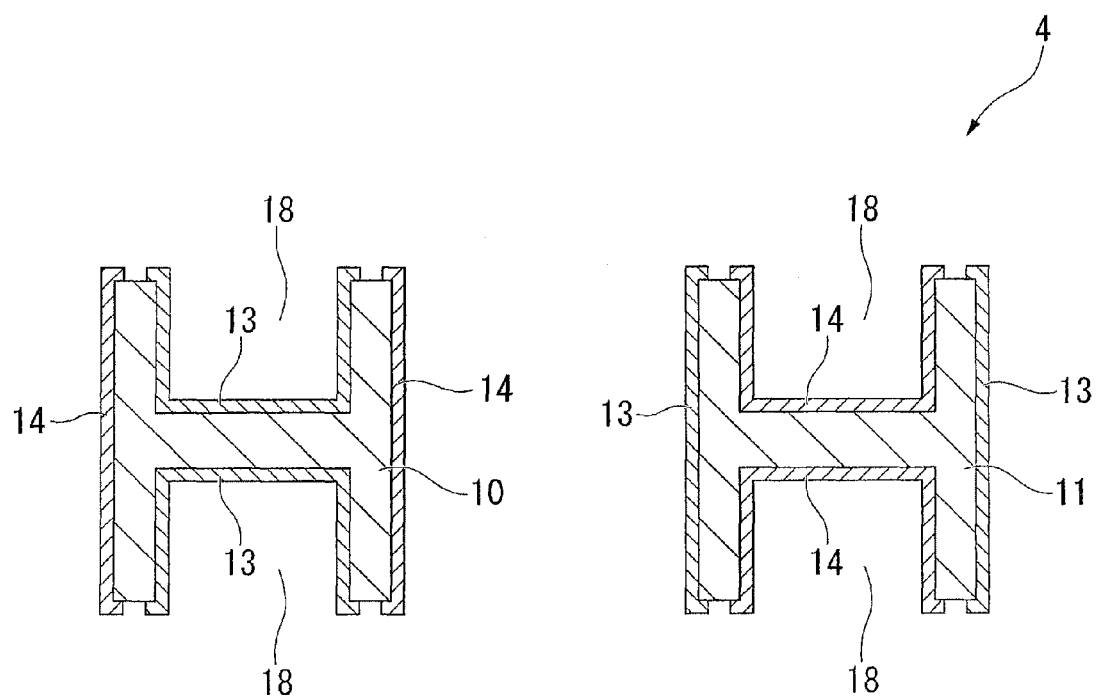
FIG. 7 is a sectional view taken along the line B-B in FIG. 5.

FIG. 5 is a top view of the piezoelectric vibrating reed, FIG. 6 is a bottom view, and FIG. 7 is a sectional view taken along the line B-B in FIG. 5.

As shown in FIGS. 5 to 7, the piezoelectric vibrating reed 4 is a tuning-fork type vibrating reed which is made of a piezoelectric material such as quartz crystal, lithium tantalate, or lithium niobate and is configured to vibrate when a predetermined voltage is applied thereto. The piezoelectric vibrating reed 4 includes: a pair of vibrating arms 10 and 11 disposed in parallel to each other; a base portion 12 to which the base end sides of the pair of vibrating arms 10 and 11 are integrally fixed; groove portions 18 which are formed on both principal surfaces of the pair of vibrating arms 10 and 11. The groove portions 18 are formed so as to extend from the base end sides of the vibrating arms 10 and 11 along the longitudinal direction of the vibrating arms 10 and 11 up to approximately the middle portions thereof.

In addition, the piezoelectric vibrating reed 4 of the present embodiment includes: an excitation electrode 15 which is formed on the outer surfaces of the pair of vibrating arms 10 and 11 so as to allow the pair of vibrating arms 10 and 11 to vibrate and includes a first excitation electrode 13 and a second excitation electrode 14; and mount electrodes 16 and 17 which are electrically connected to the first excitation electrode 13 and the second excitation electrode 14, respectively. The excitation electrode 15, mount electrodes 16 and 17, and extraction electrodes 19 and 20 are formed by a coating of a conductive film of chromium (Cr), nickel (Ni), aluminum (Al), and titanium (Ti), for example.

The excitation electrode 15 is an electrode that allows the pair of vibrating arms 10 and 11 to vibrate at a predetermined resonance frequency in a direction to move closer to or away from each other. The first excitation electrode 13 and second excitation electrode 14 that constitute the excitation electrode 15 are patterned and formed on the outer surfaces of the pair of vibrating arms 10 and 11 in an electrically isolated state. Specifically, the first excitation electrode 13 is mainly formed on the groove portion 18 of one vibrating arm 10 and both side surfaces of the other vibrating arm 11. On the other hand, the second excitation electrode 14 is mainly formed on both side surfaces of one vibrating arm 10 and the groove portion 18 of the other vibrating arm 11. Moreover, the first excitation electrode 13 and the second excitation electrode 14 are electrically connected to the mount electrodes 16 and 17 via the extraction electrodes 19 and 20, respectively, on both principal surfaces of the base portion 12.

Furthermore, the tip ends of the vibrating arms 10 and 11 are coated with a weight metal film 21 for adjustment of their own vibration states (tuning the frequency) of the vibrating arms 10 and 11 in a manner such as to vibrate within a predetermined frequency range. The weight metal film 21 is divided into a rough tuning film 21a used for tuning the frequency roughly and a fine tuning film 21b used for tuning the frequency finely.

As shown in FIGS. 1, 3, and 4, the lid board 3 is a board that can be anodically bonded and that is made of a glass material, for example, soda-lime glass, and is formed in a board-like form. On a bonding surface side of the lid board 3 to be bonded to the base board 2, a recess portion 3a for a cavity C is formed in which the piezoelectric vibrating reed 4 is accommodated.

A bonding material 35 for anodic bonding is formed on the entire surface on the bonding surface side of the lid board 3 to be bonded to the base board 2. That is to say, the bonding material 35 is formed in a frame region at the periphery of the recess portion 3a in addition to the entire inner surface of the recess portion 3a. Although the bonding material 35 of the present embodiment is made of a Si film, the bonding material 35 may be made of Al. In addition, as the bonding material, a Si bulk material whose resistance is reduced by doping or the like may be used. As will be described later, the bonding material 35 and the base board 2 are anodically bonded, whereby the cavity C is vacuum-sealed.

The base board 2 is a board that is made of a glass material, for example, soda-lime glass, and is formed in an approximately board-like form having the same outer shape as the lid board 3 as shown in FIGS. 1 to 4.

On an upper surface 2a side (a bonding surface side to be bonded to the lid board 3) of the base board 2, a pair of lead-out electrodes 36 and 37 is patterned as shown in FIGS. 1 to 4. The lead-out electrodes 36 and 37 are formed by a laminated structure of a lower Cr film and an upper Au film, for example.

As shown in FIGS. 3 and 4, the mount electrodes 16 and 17 of the above-described piezoelectric vibrating reed 4 are bump-bonded to the surfaces of the lead-out electrodes 36 and 37 via bumps B made of gold or the like. The piezoelectric vibrating reed 4 is bonded in a state where the vibrating arms 10 and 11 are floated from the upper surface 2a of the base board 2.

In addition, a pair of penetration electrodes 32 and 33 is formed on the base board 2 so as to penetrate through the base board 2. The penetration electrodes 32 and 33 are made of a conductive metallic material such as stainless steel, Ag, or Al. One penetration electrode 32 is formed right below one lead-out electrode 36. The other penetration electrode 33 is formed in the vicinity of a tip end of the vibrating arm 11 and is connected to the other lead-out electrode 37 via a lead-out wiring.

In addition, on a lower surface 2b of the base board 2, a pair of outer electrodes 38 and 39 is formed as shown in FIGS. 1, 3, and 4. The pair of outer electrodes 38 and 39 is formed at both ends in the longitudinal direction of the base board 2 and is electrically connected to the pair of penetration electrodes 32 and 33.

When the piezoelectric vibrator 1 configured in the way is operated, a predetermined drive voltage is applied between the outer electrodes 38 and 39 formed on the base board 2. By doing so, current flows from the one outer electrode 38 to the first excitation electrode 13 of the piezoelectric vibrating reed 4 through the one penetration electrode 32 and the one lead-out electrode 36. Moreover, current flows from the other outer electrode 39 to the second excitation electrode 14 of the piezoelectric vibrating reed 4 through the other penetration electrode 33 and the other lead-out electrode 37. In this way, current can be made to flow to the excitation electrode 15 including the first and second excitation electrodes 13 and 14 of the piezoelectric vibrating reed 4, and the pair of vibrating arms 10 and 11 is allowed to vibrate at a predetermined frequency in a direction to move closer to or away from each other. The vibration of the pair of vibrating arms 10 and 11 can be used as the time source, the timing source of a control signal, the reference signal source, and the like.

Manufacturing Method of Piezoelectric Vibrator

Figure 8:
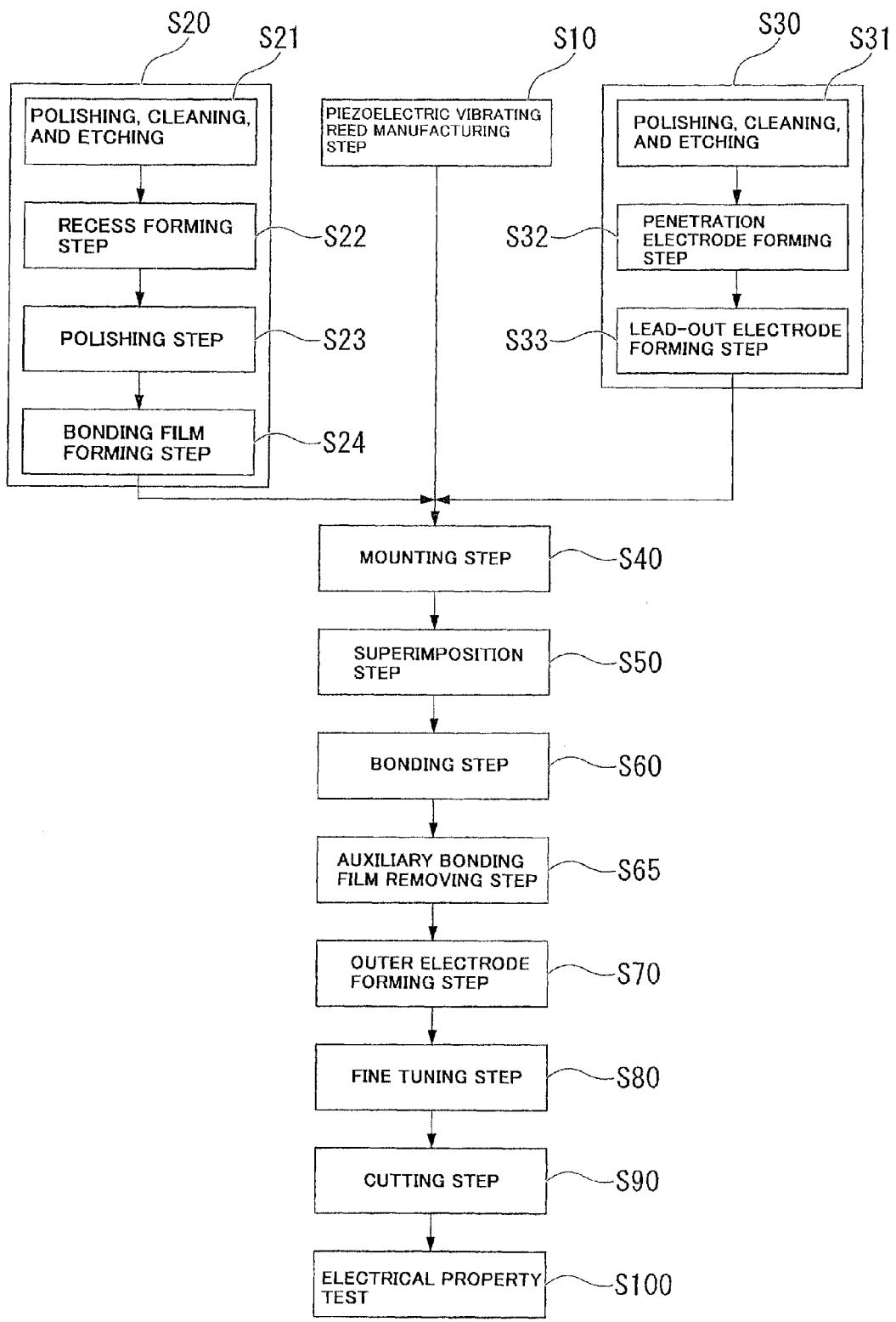
FIG. 8 is a flowchart of the manufacturing method of a piezoelectric vibrator according to an embodiment.
Figure 9:
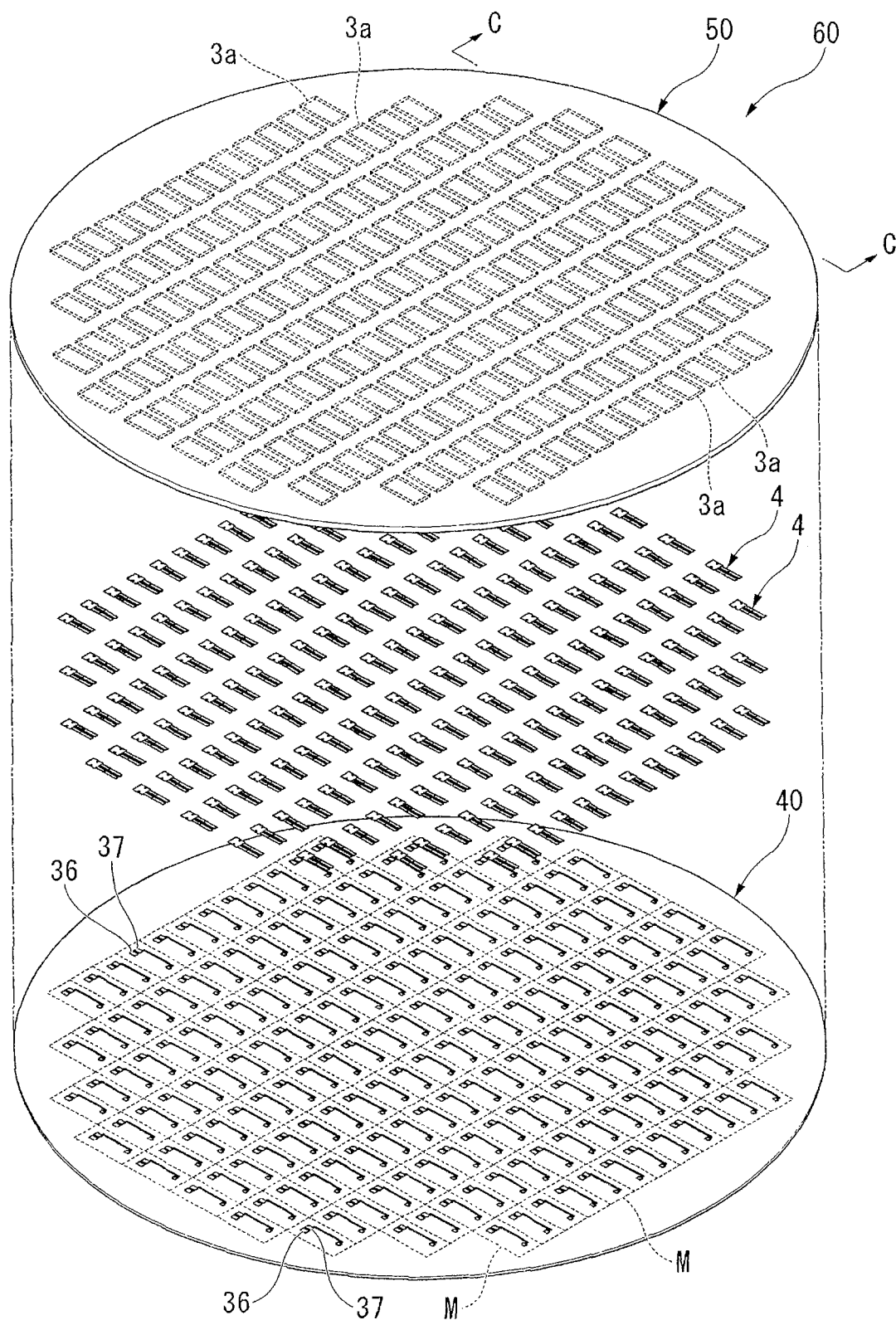
FIG. 9 is an exploded perspective view of a wafer assembly.

Next, the manufacturing method of the piezoelectric vibrator according to the present embodiment will be described. FIG. 8 is a flowchart of the manufacturing method of the piezoelectric vibrator according to the present embodiment. FIG. 9 is an exploded perspective view of a wafer assembly. In the following, a method for manufacturing a plurality of piezoelectric vibrators at a time by enclosing a plurality of piezoelectric vibrating reeds 4 between a base board wafer 40 and a lid board wafer 50 to form a wafer assembly 60 and cutting the wafer assembly 60 will be described. The dotted line M shown in the respective figures starting with FIG. 9 is a cutting line along which a cutting step performed later is achieved.

The manufacturing method of the piezoelectric vibrator according to the present embodiment mainly includes a piezoelectric vibrating reed manufacturing step (S10), a lid board wafer manufacturing step (S20), a base board wafer manufacturing step (S30), and an assembling step (S40 and subsequent steps). Among the steps, the piezoelectric vibrating reed manufacturing step (S10), the lid board wafer manufacturing step (S20), and the base board wafer manufacturing step (S30) can be performed in parallel. In addition, the manufacturing method of the piezoelectric vibrator according to the present embodiment includes a method for manufacturing a package in which a lid board and a base board are anodically bonded with a bonding material interposed therebetween. The package manufacturing method mainly includes a bonding material forming step (S24), a bonding step (S60), and an auxiliary bonding material removing step (S65).

In the piezoelectric vibrating reed manufacturing step (S10), the piezoelectric vibrating reed 4 shown in FIGS. 5 to 7 is manufactured. Specifically, first, a rough quartz crystal lambert is sliced at a predetermined angle to obtain a wafer having a constant thickness. Subsequently, the wafer is subjected to crude processing by lapping, and an affected layer is removed by etching. Then, the wafer is subjected to mirror processing such as polishing to obtain a wafer having a predetermined thickness. Subsequently, the wafer is subjected to appropriate processing such as washing, and the wafer is patterned so as to have the outer shape of the piezoelectric vibrating reed 4 by a photolithography technique. Moreover, a metal film is formed and patterned on the wafer, thus forming the excitation electrode 15, the extraction electrodes 19 and 20, the mount electrodes 16 and 17, and the weight metal film 21. In this way, a plurality of piezoelectric vibrating reeds 4 can be manufactured. Subsequently, rough tuning of the resonance frequency of the piezoelectric vibrating reed 4 is performed. This rough tuning is achieved by irradiating the rough tuning film 21a of the weight metal film 21 with a laser beam to evaporate in part the rough tuning film 21a, thus changing the weight of the vibrating arm.

In the lid board wafer manufacturing step (S20), the lid board wafer 50 later serving as the lid board 3 is manufactured. In this step, first, a disk-shaped lid board wafer 50 made of a soda-lime glass is polished to a predetermined thickness and cleaned, and then, an affected uppermost layer is removed by etching or the like (S21). Subsequently, a plurality of recess portions 3a to be used as a cavity is formed on a bonding surface of the lid board wafer 50 to be bonded to the base board wafer 40 (S22). The recess portions 3a are formed by heat-press molding, etching, or the like. After that, the bonding surface bonded to the base board wafer 40 is polished (S23).

Subsequently, a bonding material 35 is formed on the bonding surface to be bonded to the base board wafer 40 (S24). The bonding material 35 may be formed on the entire inner surface of the recess portion 3a in addition to the bonding surface to be bonded to the base board wafer 40. In this way, patterning of the bonding material 35 is not necessary, and the manufacturing cost can be reduced. The bonding material 35 can be formed by a film-formation method such as sputtering or CVD. Since the polishing step (S23) is performed before the bonding material forming step (S24), the flatness of the surface of the bonding material 35 can be secured, and stable bonding with the base board wafer 40 can be achieved.

In the base board wafer manufacturing step (S30), the base board wafer 40 later serving as the base board 2 is manufactured. In this step, first, a disk-shaped base board wafer 40 made of a soda-lime glass is polished to a predetermined thickness and cleaned, and then, an affected uppermost layer is removed by etching or the like (S31). Subsequently, a penetration electrode foaming step is performed where the pair of penetration electrodes 32 and 33 is formed on the base board wafer 40 (S32). The penetration electrodes 32 and 33 are formed by forming the through-holes 30 and 31 in the base board wafer 40, filling a conductive material such as a silver paste in the through-holes 30 and 31, and baking the conductive material. Subsequently, a lead-out electrode forming step is performed where the lead-out electrodes 36 and 37 are formed so as to be electrically connected to the pair of penetration electrodes 32 and 33 (S33).

Meanwhile, forming the bonding material 35 on the surface of the base board wafer 40 together with the lead-out electrodes 36 and 37 may be considered. However, in this case, the bonding material 35 is formed after formation of the lead-out electrodes 36 and 37 and the manufacturing time will increase. In addition, in order to prevent diffusion between both members, it is necessary to form the bonding material 35 while masking the lead-out electrodes 36 and 37, and thus the manufacturing process becomes complicated. On the contrary, in the present embodiment, the bonding material 35 is formed on the lid board wafer 50, and the lead-out electrodes 36 and 37 are formed on the base board wafer 40. Therefore, the formation of the lead-out electrodes 36 and 37 can be performed in parallel with the formation of the bonding material 35, and thus the manufacturing time can be reduced. In addition, since it is not necessary to consider diffusion between both members, it is possible to simplify the manufacturing process.

In a mounting step (S40), a plurality of manufactured piezoelectric vibrating reeds 4 is bonded to the upper surfaces of the lead-out electrodes 36 and 37 of the base board wafer 40. Specifically, first, bumps B made of gold or the like are formed on the pair of lead-out electrodes 36 and 37. The base portion 12 of the piezoelectric vibrating reed 4 is placed on the bumps B, and the piezoelectric vibrating reed 4 is pressed against the bumps B while heating the bumps B to a predetermined temperature. In this way, the base portion 12 is mechanically fixed to the bumps B in a state where the vibrating arms 10 and 11 of the piezoelectric vibrating reed 4 are floated from the upper surface of the base board wafer 40. In addition, the mount electrodes 16 and 17 are electrically connected to the lead-out electrodes 36 and 37.

In a superimposition step (S50), the lid board wafer 50 is superimposed onto the base board wafer 40 on which the mounting of the piezoelectric vibrating reed 4 is completed. Specifically, both wafers 40 and 50 are aligned at a correct position using reference marks or the like not shown in the figure as indices. In this way, the piezoelectric vibrating reed 4 mounted on the base board wafer 40 is accommodated in the cavity C which is surrounded by the recess portion 3a of the lid board wafer 50 and the base board wafer 40.

Bonding Step

Figure 10:
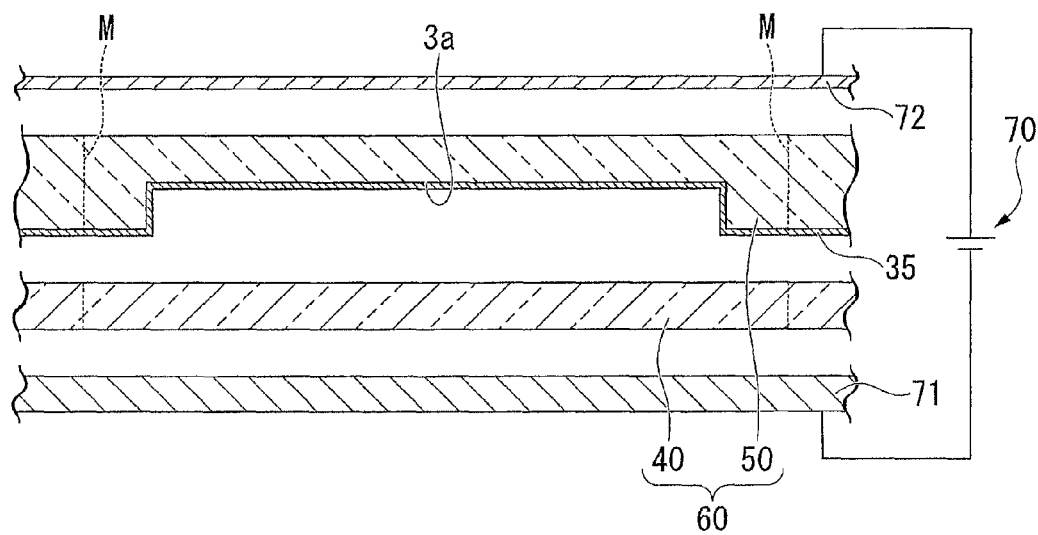
FIGS. 10A and 10B illustrate a bonding step and are partially enlarged sectional views taken along the line C-C in FIG. 9.
Figure 10:
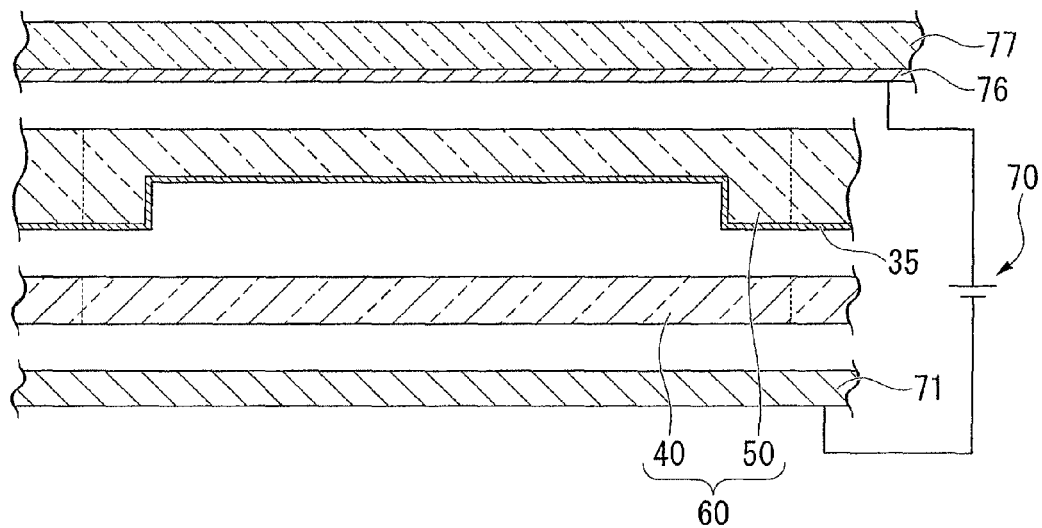
Figure 11:
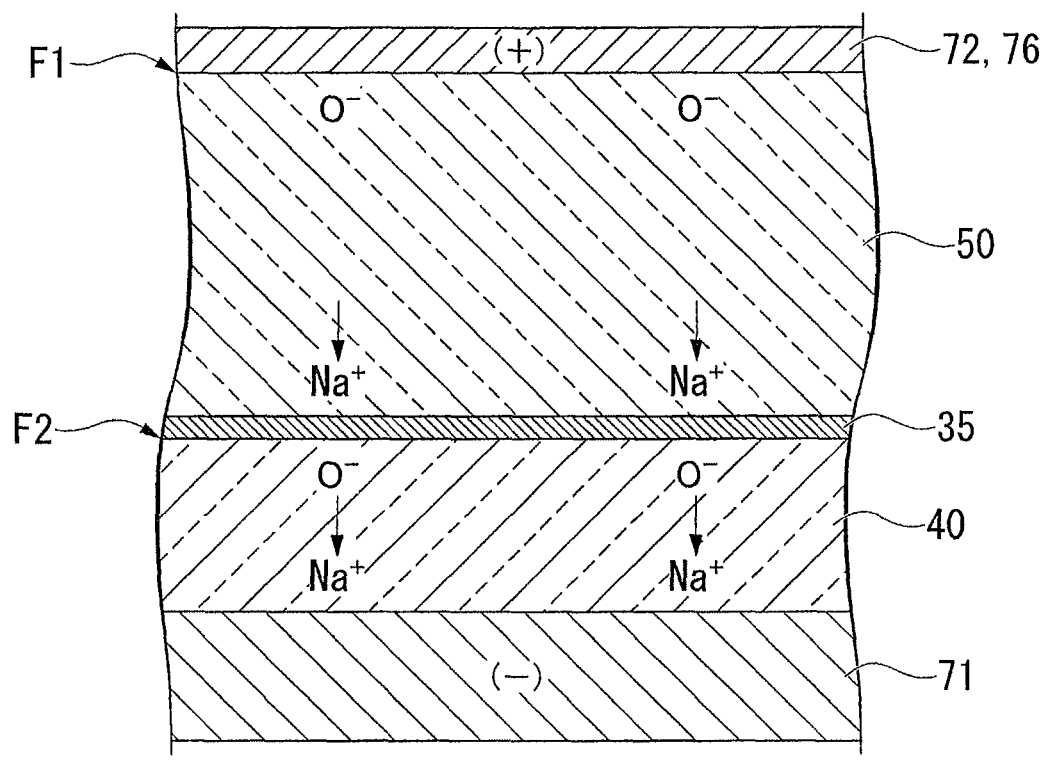
FIG. 11 is a view illustrating a bonding reaction.

FIGS. 10A and 10B and FIG. 11 illustrate the bonding step and partially enlarged sectional views taken along the line C-C in FIG. 9.

As shown in FIG. 10A, in a bonding step (S60), the auxiliary bonding material 72 is disposed on the upper surface of the lid board wafer 50. The auxiliary bonding material 72 is made of a material that causes an anodic bonding reaction between the auxiliary bonding material 72 and the lid board wafer 50. Specifically, the auxiliary bonding material 72 is made of a bonding material which is a material capable of moving sodium ions included in a glass toward a cathode to form a negative charge layer on a side of the glass close to the auxiliary bonding material when the auxiliary bonding material, the glass and an electrode are superimposed onto each other and heated, and a voltage was applied between the auxiliary bonding material serving as the anode and the electrode serving as the cathode. More specifically, as the material of the auxiliary bonding material 72, aluminum (Al), a silicon (Si) bulk material, and a thin film or a bulk material of chrome (Cr), carbon (C), and the like can be used. The bulk material is a board-like member having a considerable thickness. In the present embodiment shown in FIG. 10A, an aluminum foil is used as the auxiliary bonding material 72. By using an aluminum foil which is easy to handle and cheap, it is possible to suppress an increase in manufacturing cost.

In a bonding step (S60), the auxiliary bonding material 72 is disposed on the upper surface of the lid board wafer 50, and an electrode 71 is disposed on the lower surface of the base board wafer 40. The electrode 71 is made of stainless steel, carbon (C), or the like. Subsequently, the auxiliary bonding material 72 and the electrode 71 are pressed to be sandwiched by a jig (not shown) so as to apply pressure to the wafer assembly 60. After that, the wafer assembly 60 is inserted into an anodic bonding machine for each jig. Subsequently, the inside of the anodic bonding machine is maintained at a predetermined temperature so as to heat the wafer assembly 60. At the same time, a DC power supply 70 is connected so that the auxiliary bonding material 72 serves as the anode and the electrode 71 serves as the cathode, and a voltage is applied to the wafer assembly 60. Since the auxiliary bonding material 72 of the present embodiment is made of aluminum having a small resistance value, there will be no voltage drop in the auxiliary bonding material 72, and thus a uniform voltage can be applied to the entire surface of the lid board wafer 50.

In this way, as shown in FIG. 11, sodium ions included in the glass material of the lid board wafer 50 will move towards the bonding material 35. In conjunction with this, sodium ions included in the glass material of the base board wafer 40 will move towards the electrode 71, and current is made to flow. Therefore, a negative charge layer in which sodium ions are deficient will be formed on a side of the base board wafer 40 close to the bonding material 35. An electrostatic attractive force will be generated between the negative charge layer and the bonding material 35, and the base board wafer 40 and the bonding material 35 are anodically bonded at their interface F2. A negative charge layer in which sodium ions are deficient is also formed on a side of the lid board wafer 50 close to the auxiliary bonding material 72. Therefore, the lid board wafer 50 and the auxiliary bonding material 72 are also anodically bonded at their interface F1.

Meanwhile, in a modification of the present embodiment shown in FIG. 10B, a Si film is used as an auxiliary bonding material 76. By forming a Si film on the surface of an auxiliary bonding board 77 made of an insulating material such as glass, the Si film can be used as the auxiliary bonding material 76. In this modification, the auxiliary bonding board 77 and the electrode 71 are pressed to be sandwiched by a jig so as to apply pressure to the wafer assembly 60. The DC power supply 70 is connected to the Si film to apply a voltage between the Si film and the electrode 71. When the Si film is formed to be thick, since the resistance value of the Si film decreases, it is possible to suppress a voltage drop in the Si film. Similarly, in this modification, it is possible to achieve anodic bonding between the base board wafer 40 and the bonding material 35. However, in this modification, the auxiliary bonding material 76 in a state of being fixed to the auxiliary bonding board 77 is anodically bonded to the lid board wafer 50.

Auxiliary Bonding Material Removing Step

Figure 12:
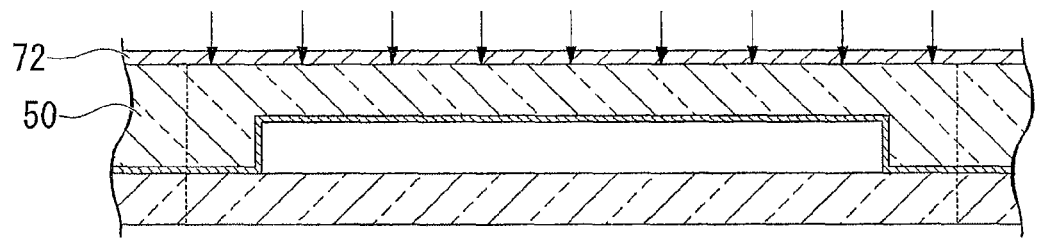
FIGS. 12A and 12B illustrate auxiliary bonding material removing step and are partially enlarged views taken along the line C-C in FIG. 9.
Figure 12:
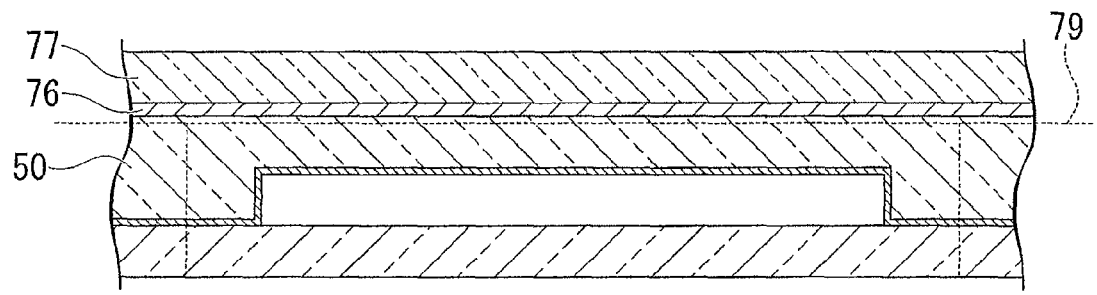

FIGS. 12A and 12B illustrate an auxiliary bonding material removing step and are partially enlarged sectional views taken along the line C-C in FIG. 9.

As shown in FIG. 12A, in an auxiliary bonding material removing step (S65), the auxiliary bonding material 72 anodically bonded to the lid board wafer 50 is removed. In the present embodiment, since an aluminum foil is anodically bonded to the upper surface of the lid board wafer 50 as the auxiliary bonding material 72, the aluminum foil is removed by etching. The aluminum foil can be etched using a halogen-based etching gas. Since the thickness of the aluminum foil is as thin as several tens of μm, the aluminum foil can be removed by a short period of etching.

Meanwhile, in a modification of the present embodiment shown in FIG. 12B, the auxiliary bonding board 77 is fixed to the upper surface of the lid board wafer 50 in addition to the Si film which is the auxiliary bonding material 76. Therefore, in this modification, the auxiliary bonding material 76 and the auxiliary bonding board 77 are removed by grinding. Specifically, the auxiliary bonding material 76 and the auxiliary bonding board 77 are ground up to the top layer of the lid board wafer 50 indicated by a broken line 79 using a grinder or the like. According to the grinding, even when the thick auxiliary bonding board 77 is fixed, it is possible to remove the auxiliary bonding board 77 and the auxiliary bonding material 76 in a short period of time.

In the present embodiment shown in FIG. 12A, the aluminum foil can be removed by grinding or polishing.

In an outer electrode forming step (S70), the outer electrodes 38 and 39 are formed on the back surface of the base board wafer.

In this step, it is preferable to perform a gettering step. Specifically, a gettering material which is formed in advance in the inner surface of the cavity is irradiated with a laser beam. By doing so, since the gettering material is evaporated to combine with oxygen in the cavity, it is possible to improve the degree of vacuum in the cavity. As the gettering material, chrome (Cr), aluminum (Al), and the like can be used.

In a fine tuning step (S80), the frequencies of the individual piezoelectric vibrators 1 are tuned finely. Specifically, first, a predetermined voltage is continuously applied from the outer electrodes 38 and 39 to vibrate the piezoelectric vibrating reed 4, and the vibration frequency is measured. In this state, a laser beam is irradiated onto the base board wafer 40 from the outer side to evaporate the fine tuning film 21b of the weight metal film 21. By doing so, the weight on the tip end sides of the pair of vibrating arms 10 and 11 decreases, and as a result the frequency of the piezoelectric vibrating reed 4 increases. In this way, the frequency of the piezoelectric vibrator 1 is tuned finely so as to fall within the range of the nominal frequency.

In a cutting step (S90), the bonded wafer assembly 60 is cut along the cutting line M. Specifically, first, a UV tape is attached on the surface of the base board wafer 40 of the wafer assembly 60. Subsequently, a laser beam is irradiated along the cutting line M from the side of the lid board wafer 50 (scribing). Subsequently, the wafer assembly 60 is divided and cut along the cutting line M by a cutting blade pressing against the surface of the UV tape (breaking). After that, the UV tape is separated by irradiation of UV light. In this way, it is possible to divide the wafer assembly 60 into a plurality of piezoelectric vibrators. The wafer assembly 60 may be cut by other methods such as dicing.

In an electrical property test step (S100), the resonance frequency, resonance resistance value, drive level properties (the excitation power dependence of the resonance frequency and the resonance resistance value), and the like of the piezoelectric vibrator 1 are measured and checked. Moreover, the insulation resistance properties and the like are checked as well. Finally, an external appearance test of the piezoelectric vibrator 1 is conducted to check the dimensions, the quality, and the like.

In this way, the piezoelectric vibrator 1 is manufactured.

As described above, the package manufacturing method according to the present embodiment includes the anodic bonding step where the bonding material 35 is formed on the inner surface of the lid board wafer 50, the auxiliary bonding material 72 serving as the anode is disposed on the outer surface of the lid board wafer 50, the electrode 71 serving as the cathode is disposed on the outer surface of the base board wafer 40, and a voltage is applied between the auxiliary bonding material 72 and the electrode 71, in which the auxiliary bonding material 72 is made of a material that causes an anodic bonding reaction between the auxiliary bonding material 72 and the lid board wafer 50 in the anodic bonding step.

According to this configuration, when a voltage is applied between the auxiliary bonding material 72 and the electrode 71, an anodic bonding reaction occurs between the auxiliary bonding material 72 and the outer surface of the lid board wafer 50, and in conjunction with this, the bonding material 35 and the inner surface of the base board wafer 40 are anodically bonded. In this way, even when the bonding material 35 having a large resistance value is used, it is possible to apply a uniform voltage to the entire surface of the bonding material 35 and achieve reliable anodic bonding between the bonding material 35 and the inner surface of the base board wafer 40. In addition, since the resistance value of the auxiliary bonding material 72 can be set arbitrarily, by using the auxiliary bonding material 72 having a small resistance value, it is possible to achieve the anodic bonding under the same condition as the case of using a bonding material having a small resistance value. As long as the auxiliary bonding material 72 having a small resistance value than the bonding material 35 is used, and the DC power supply 70 is connected to the auxiliary bonding material 72, it is possible to achieve anodic bonding under a less strict condition (low voltage) than the case of connecting the DC power supply to the bonding material 35.

In addition, in the present embodiment, the bonding material 35 is made of a Si film.

Since the Si film has a large sheet resistance, the resistance increases when the thin bonding material is made of Si. However, according to the present invention, it is possible to achieve reliable anodic bonding between the bonding material 35 and the inner surface of the base board wafer 40. Moreover, as shown in FIG. 3, even when the bonding material 35 used for the anodic bonding is exposed to the outside of the bonded package 9, since the bonding material 35 made of Si will not be corroded, it is possible to prevent degradation of airtightness of the package 9.

Oscillator

Next, an oscillator according to an embodiment of the present invention will be described with reference FIG. 13.

Figure 13:
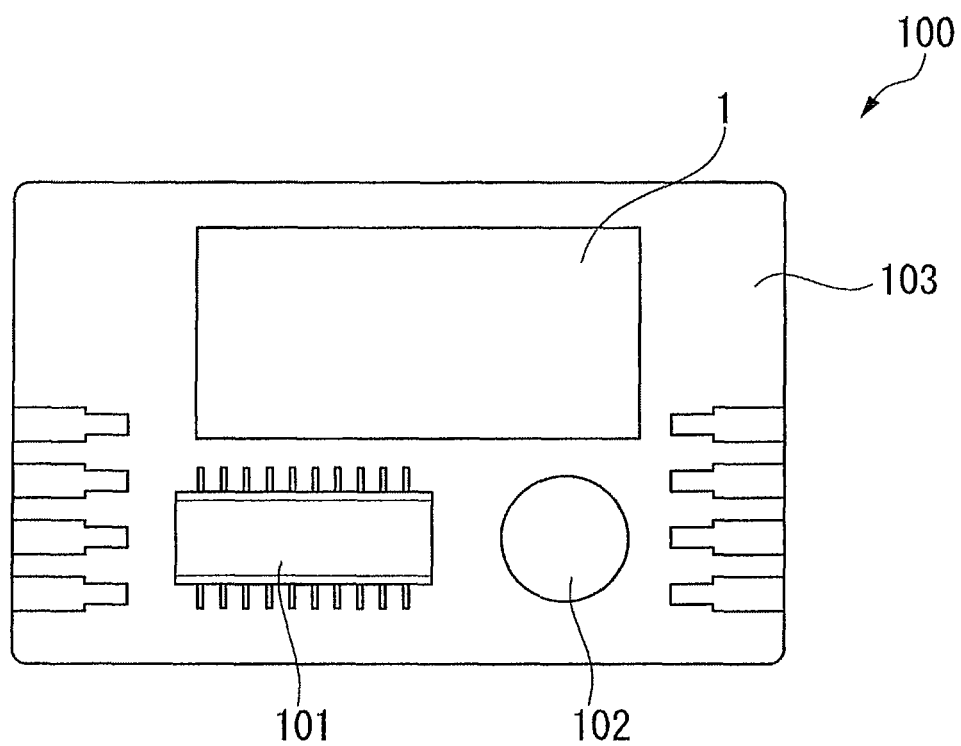
FIG. 13 is a view showing the configuration of an oscillator according to an embodiment.

As shown in FIG. 13, an oscillator 100 of the present embodiment is one in which the piezoelectric vibrator 1 is configured as an oscillating piece that is electrically connected to an integrated circuit 101. The oscillator 100 includes a board 103 on which an electronic component 102 such as a capacitor is mounted. The integrated circuit 101 for the oscillator is mounted on the board 103, and the piezoelectric vibrator 1 is mounted in the vicinity of the integrated circuit 101. The electronic component 102, integrated circuit 101, and piezoelectric vibrator 1 are electrically connected by a wiring pattern which is not shown. It should be noted that these components are molded by resin which is not shown.

In the oscillator 100 configured in this manner, the piezoelectric vibrating reed 4 in the piezoelectric vibrator 1 vibrates when a voltage is applied to the piezoelectric vibrator 1. This vibration is converted to an electrical signal by the piezoelectric properties of the piezoelectric vibrating reed 4 and is then input to the integrated circuit 101 as the electrical signal. The input electrical signal is subjected to various kinds of processing by the integrated circuit 101 and is then output as a frequency signal. In this way, the piezoelectric vibrator 1 functions as an oscillating piece.

By selectively setting the configuration of the integrated circuit 101, for example, an RTC (Real Time Timepiece) module, according to the demands, it is possible to add a function of controlling the date or time for operating the device or an external device or providing the time or calendar other than a single-function oscillator for a timepiece.

As described above, according to the oscillator 100 of the present embodiment, since the oscillator includes the high-quality piezoelectric vibrator 1 having an improved yield in which the base board 2 and the lid board 3 are reliably anodically bonded, and reliable airtightness in the cavity C is secured, it is possible to achieve improvements in the operational reliability and high quality of the oscillator 100 itself which provide stable conductivity. In addition to this, it is possible to obtain a highly accurate frequency signal which is stable over a long period of time.

Electronic Device

Figure 14:
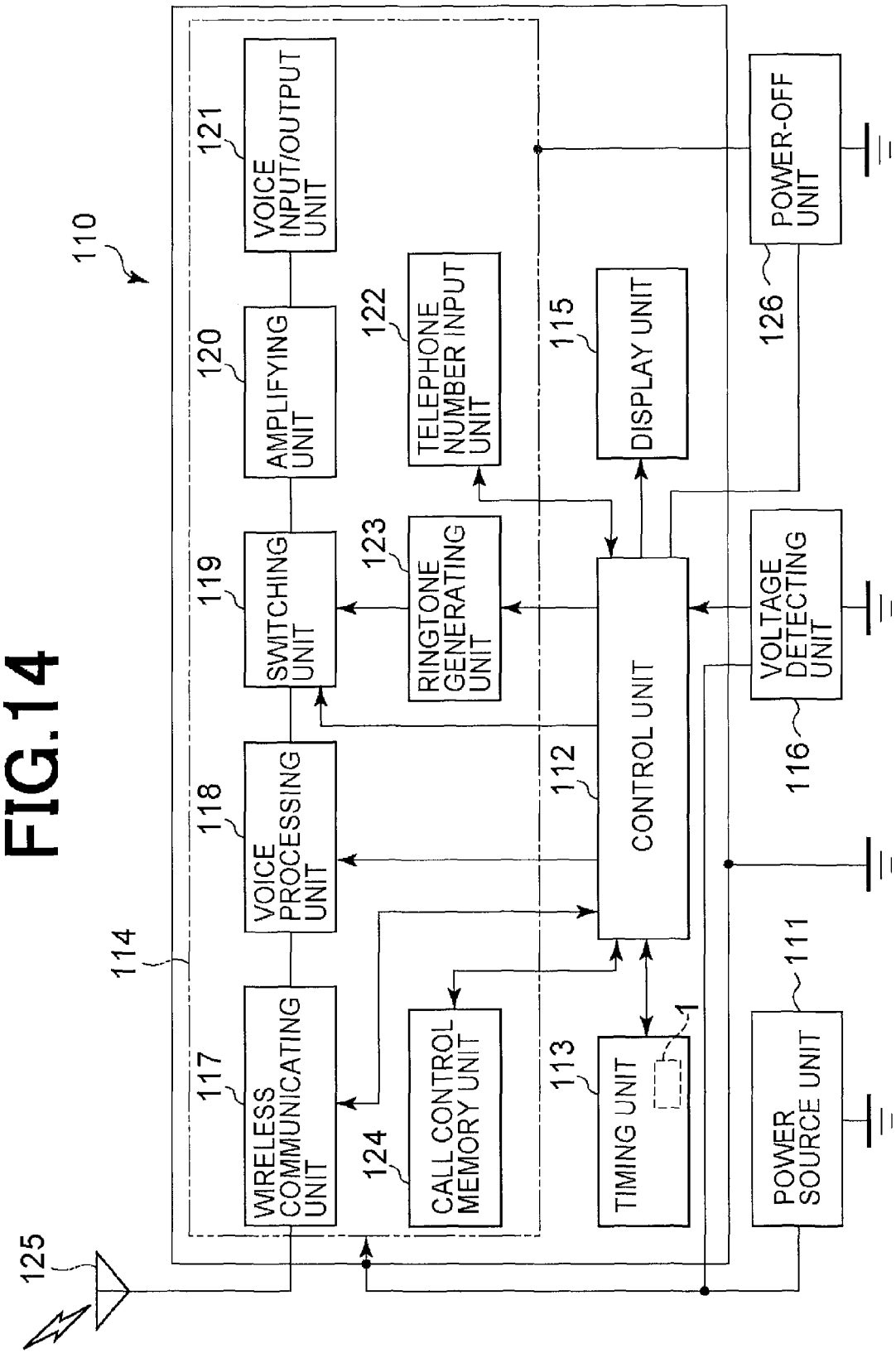
FIG. 14 is a view showing the configuration of an electronic device according to an embodiment.

Next, an electronic device according to an embodiment of the present invention will be described with reference to FIG. 14. The present embodiment will be described by way of an example of a portable information device 110 having the piezoelectric vibrator 1 as an example of the electronic device.

First, the portable information device 110 of the present embodiment is represented, for example, by a cellular phone and is one that develops and improves a wristwatch of the related art. The portable information device 110 looks like a wristwatch in external appearance and is provided with a liquid crystal display at a portion corresponding to the dial pad and is capable of displaying the current time or the like on the screen. When the portable information device 110 is used as a communication tool, the user removes it from the wrist and performs communication as with a cellular phone of the related art using the internal speaker and microphone on the inner side of its strap. However, the portable information device 110 is remarkably small and light compared with the cellular phone of the related art.

Next, the configuration of the portable information device 110 of the present embodiment will be described. As shown in FIG. 14, the portable information device 110 includes the piezoelectric vibrator 1 and a power supply portion 111 for supplying power. The power supply portion 111 is formed, for example, of a lithium secondary battery. The power supply portion 111 is connected in parallel to a control portion 112 that performs various kinds of control, a timer portion 113 that counts the time or the like, a communication portion 114 that performs communication with the outside, a display portion 115 that displays various kinds of information, and a voltage detection portion 116 that detects voltages at the respective function portions. The power supply portion 111 supplies power to the respective functional portions.

The control portion 112 controls the respective function portions so as to control operations of the overall system, such as operations to transmit and receive sound data and operations to count and display the current time. The control portion 112 includes a ROM in which a program is written in advance, a CPU that reads out and runs the program written to the ROM, a RAM used as a work area of the CPU, and the like.

The timer portion 113 includes an integrated circuit enclosing an oscillation circuit, a register circuit, a counter circuit, and an interface circuit, and the like as well as the piezoelectric vibrator 1. When a voltage is applied to the piezoelectric vibrator 1, the piezoelectric vibrating reed 4 vibrates, and this vibration is converted to an electrical signal by the piezoelectric characteristics of the quartz and is input to the oscillation circuit as the electrical signal. The output of the oscillation circuit is converted to a digital form and counted by the register circuit and the counter circuit. Signals are transmitted and received to and from the control portion 112 via the interface circuit, and the current time and the current date or the calendar information or the like are displayed on the display portion 115.

The communication portion 114 is provided with the same functions as those of the cellular phone of the related art, and includes a wireless portion 117, a sound processing portion 118, a switching portion 119, an amplifier portion 120, a sound input/output portion 121, a telephone number input portion 122, a ring tone generation portion 123, and a call control memory portion 124.

The wireless portion 117 carries out transmission and reception of various kinds of data, such as sound data, with the base station via an antenna 125. The sound processing portion 118 encodes and decodes a sound signal input therein from the wireless portion 117 or the amplifier portion 120. The amplifier portion 120 amplifies a signal input therein from the sound processing portion 118 or the sound input/output portion 121 to a predetermined level. The sound input/output portion 121 is formed of a speaker and a microphone, and makes a ring tone and an incoming sound louder, as well as collecting sounds.

The ring tone generation portion 123 generates a ring tone in response to a call from the base station. The switching portion 119 switches the amplifier portion 120 normally connected to the sound processing portion 118 to the ring tone generation portion 123 only when a call arrives, so that the ring tone generated in the ring tone generation portion 123 is output to the sound input/output portion 121 via the amplifier portion 120.

The call control memory portion 124 stores a program relating to incoming and outgoing call control for communications. The telephone number input portion 122 includes, for example, numeric keys from 0 to 9 and other keys and the user inputs the telephone number of the communication party by depressing these numeric keys.

The voltage detection portion 116 detects a voltage drop when a voltage being applied to each function portion, such as the control portion 112, by the power supply portion 111 drops below the predetermined value, and notifies the control portion 112 of the detection. The predetermined voltage value referred to herein is a value pre-set as the lowest voltage necessary to operate the communication portion 114 in a stable manner, and for example, is about 3 V. Upon receipt of a notification of a voltage drop from the voltage detection portion 116, the control portion 112 disables the operation of the wireless portion 117, the sound processing portion 118, the switching portion 119, and the ring tone generation portion 123. In particular, it is essential to stop the operation of the wireless portion 117 that consumes a large amount of power. Furthermore, a message informing that the communication portion 114 is unavailable due to insufficient battery power is displayed on the display portion 115.

More specifically, it is possible to disable the operation of the communication portion 114 and display the notification message on the display portion 115 by the voltage detection portion 116 and the control portion 112. This message may be displayed as a character message, or as a more intuitive indication, which may be displayed by putting a cross mark on the telephone icon displayed at the top of the display screen of the display portion 115.

By providing a power shutdown portion 126 capable of selectively shutting down the power supply to portions involved with the function of the communication portion 114, it is possible to stop the function of the communication portion 114 in a more reliable manner.

According to the portable information device 110 of the present embodiment, since the portable information device includes the piezoelectric vibrator 1 having improved yield in which the base board 2 and the lid board 3 are reliably anodically bonded, and reliable airtightness in the cavity C is secured, it is possible to achieve improvement in the operational reliability and high quality of the portable information device itself which provide stable conductivity. In addition to this, it is possible to display highly accurate timepiece information which is stable over a long period of time.

Radio-Controlled Timepiece

Next, a radio-controlled timepiece according to an embodiment of the present invention will be described with reference to FIG. 15.

Figure 15:
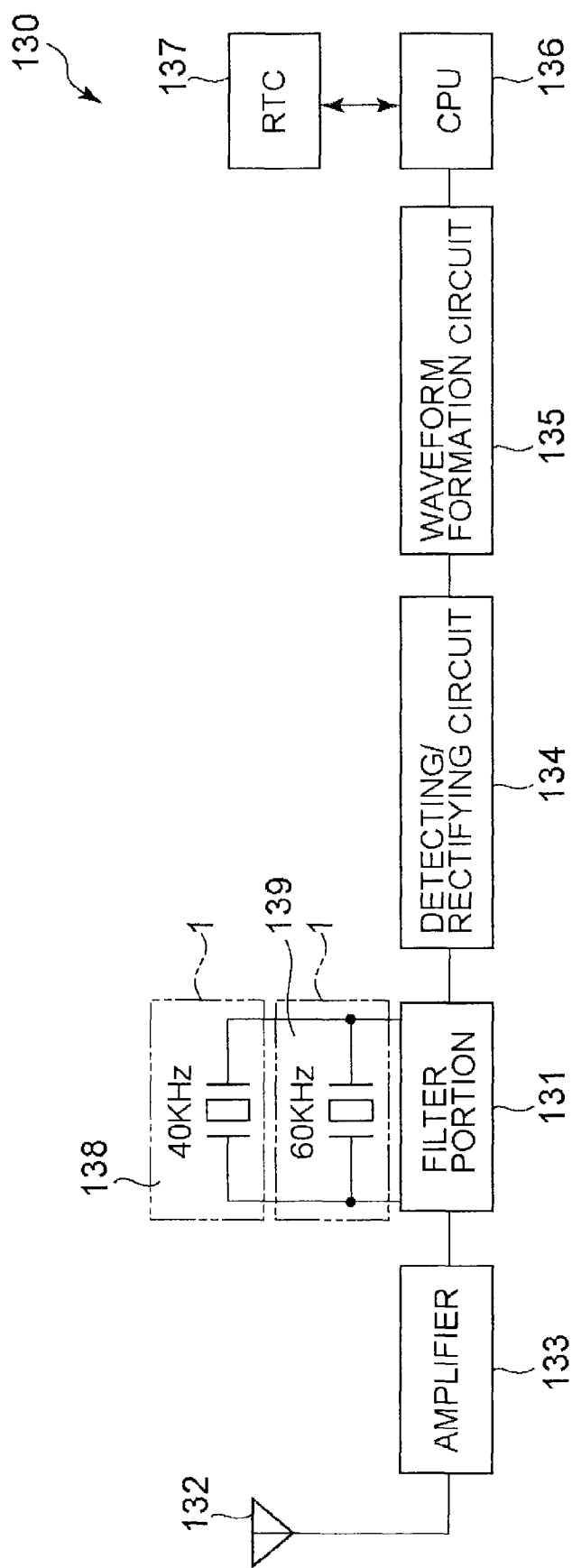
FIG. 15 is a view showing the configuration of a radio-controlled timepiece according to an embodiment.

As shown in FIG. 15, a radio-controlled timepiece 130 of the present embodiment includes the piezoelectric vibrators 1 electrically connected to a filter portion 131. The radio-controlled timepiece 130 is a timepiece provided with the function of displaying the correct time by automatically correcting the time upon receipt of a standard radio wave including the timepiece information.

In Japan, there are transmission centers (transmission stations) that transmit a standard radio wave in Fukushima Prefecture (40 kHz) and Saga Prefecture (60 kHz), and each center transmits the standard radio wave. A wave as long as 40 kHz or 60 kHz has a nature to propagate along the land surface and a nature to propagate while reflecting between the ionospheric layer and the land surface, and therefore has a propagation range wide enough to cover all Japan by the two transmission centers.

Hereinafter, the functional configuration of the radio-controlled timepiece 130 will be described in detail.

An antenna 132 receives the long standard radio wave at 40 kHz or 60 kHz. The long standard radio wave is made up of time information called a time code which is modulated by the AM modulation scheme and carried on a carrier wave of 40 kHz or 60 kHz. The received long standard wave is amplified by an amplifier 133 and filtered and synchronized by the filter portion 131 having a plurality of piezoelectric vibrators 1.

In the present embodiment, the piezoelectric vibrators 1 include quartz vibrator portions 138 and 139 having resonance frequencies at 40 kHz and 60 kHz which are the same as the carrier frequency.

Furthermore, the filtered signal at the predetermined frequency is detected and demodulated by a detection and rectification circuit 134.

Subsequently, the time code is extracted by a waveform shaping circuit 135 and counted by the CPU 136. The CPU 136 reads out information about the current year, the total number of days, a day of the week, and the time. The read information is reflected on the RTC 137 and the precise time information is displayed.

Because the carrier wave is 40 kHz or 60 kHz, a vibrator having the tuning-fork structure described above is suitable for the quartz vibrator portions 138 and 139.

Although the above description has been given to the example in Japan, the frequency of the long standard wave is different overseas. For example, a standard wave of 77.5 kHz is used in Germany. When the radio-controlled timepiece 130 which is also operable overseas is incorporated into a portable device, the piezoelectric vibrator 1 set at the frequency different from the frequencies used in Japan is required.

As described above, according to the radio-controlled timepiece 130 of the present embodiment, since the radio-controlled timepiece includes the piezoelectric vibrator 1 having improved yield in which the base board 2 and the lid board 3 are reliably anodically bonded, and reliable airtightness in the cavity C is secured, it is possible to achieve improvements in the operational reliability and high quality of the radio-controlled timepiece itself which provide stable conductivity. In addition to this, it is possible to count the time highly accurately and stably over a long period of time.

The technical scope of the invention is not limited to the embodiments described above but various changes can be made to the embodiments without departing from the gist of the invention. That is, the specific materials, the layer configurations and the like are mere examples and they can be arbitrary modified.

For example, although in the above-described embodiments, a Si film was used as the material of the bonding material, Al may be used. In this case, by using the package manufacturing method according to the present invention, it is also possible to achieve reliable anodic bonding between the bonding material and the base board wafer. When Al is used as the material of the bonding material, the bonding material disposed on the bottom surface of the recess portion of the lid board can be used as the gettering material. In this case, since it is not necessary to form the gettering material separately from the bonding material, it is possible to reduce the manufacturing cost.

In addition, although in the above-described embodiments, Al or Si was used as the auxiliary bonding material, Cr or carbon may be used. When Cr or carbon is used, even when an anodic bonding reaction occurs between the auxiliary bonding material and the first board in the anodic bonding step, the auxiliary bonding material and the first board will not be bonded together. Therefore, the auxiliary bonding member removing step can be omitted.

In addition, in the above-described embodiments, the bonding material and the inner surface of the base board wafer were anodically bonded by forming the bonding material on the inner surface of the lid board wafer, disposing the auxiliary bonding material serving as the anode on the outer surface of the lid board wafer, disposing the cathode on the outer surface of the base board wafer, and applying a voltage between the auxiliary bonding material and the cathode. To the contrary, the bonding material and the inner surface of the lid board wafer may be anodically bonded by forming the bonding material on the inner surface of the base board wafer, disposing the auxiliary bonding material serving as the anode on the outer surface of the base board wafer, disposing the cathode on the outer surface of the lid board wafer, and applying a voltage between the auxiliary bonding material and the cathode.

In addition, although in the above-described embodiments, the piezoelectric vibrator was manufactured by inserting the piezoelectric vibrating reed into the package while utilizing the package manufacturing method according to the present invention, a device other than the piezoelectric vibrator may be manufactured by inserting something other than the piezoelectric vibrating reed into the package.

The invention claimed is:

1. A method for producing piezoelectric vibrators each containing a piezoelectric vibrating strip inside, comprising:
   (a) defining a plurality of first substrates on a first wafer and a plurality of second substrates on a second wafer;
   (b) layering the first and second wafers one directly over the other such that at least some of the first substrates substantially coincide respectively with at least some of the corresponding second substrates, wherein only one layer of bonding film is sandwiched between a respective at least some of the coinciding first and second substrate pairs;
   (c) placing the layered first and second wafers between an auxiliary bonding layer and an electrode so as to sandwich opposing outer surfaces of the layered first and second wafers between the auxiliary bonding layer and the electrode in a thickness direction of the layered first and second wafers;
   (d) applying a voltage across the auxiliary bonding layer and the electrode to (i) anodically bond at least some of the coinciding first and second substrate pairs which each include the bonding film therebetween and (ii) anodically bond the auxiliary bonding layer to one of the outer surfaces of the layered first and second wafers; and
   (e) removing the anodically bonded auxiliary bonding layer from the one of the outer surfaces of the layered first and second wafers.

2. The method according to claim 1, further comprising securing the piezoelectric vibrating strip on respective at least some of the second substrates, and forming the bonding film on respective at least some of the first substrates.

3. The method according to claim 2, wherein forming the bonding film on respective at least some of the first substrates comprises forming the bonding film on an entire inner surface of the respective at least some of the first substrates.

4. The method according to claim 1, wherein removing the anodically bonded auxiliary bonding layer comprises etching the anodically bonded auxiliary bonding layer.

5. The method according to claim 1, wherein removing the anodically bonded auxiliary bonding layer comprises grinding off the anodically bonded auxiliary bonding layer.

6. The method according to claim 1, further comprising, after step (d), cutting off respective at least some of the hermetically bonded pairs from the first and second wafers.

7. The method according to claim 1, wherein the auxiliary bonding layer is layered on a board.

8. The method according to claim 1, wherein the bonding film is made of a material comprising one of Al and Si.

9. The method according to claim 1, wherein the auxiliary bonding layer is made of a material comprising one of Al, Si, Cr and C.

10. The method according to claim 1, wherein the electrode is made of a material comprising one of stainless steel and C.

* * * * *